United States Patent
Jung et al.

(10) Patent No.: US 7,834,266 B2
(45) Date of Patent: Nov. 16, 2010

(54) PHOTOVOLTAIC DEVICE

(75) Inventors: Byung-Jun Jung, Suwon-si (KR);
Moon-Jae Lee, Suwon-si (KR);
Dae-Won Kim, Suwon-si (KR);
Chang-Hee Lee, Seoul (KR); Ji-Young Kim, Seoul (KR)

(73) Assignee: Samsung SDI Co., Ltd., Gongse-dong, Giheung-gu, Yongin-si, Gyeonggi-do (KR)

( * ) Notice: Subject to any disclaimer, the term of this patent is extended or adjusted under 35 U.S.C. 154(b) by 1101 days.

(21) Appl. No.: 11/497,353

(22) Filed: Aug. 2, 2006

(65) Prior Publication Data
US 2007/0144579 A1 Jun. 28, 2007

(30) Foreign Application Priority Data
Dec. 26, 2005 (KR) .................... 10-2005-0129296

(51) Int. Cl.
*H01L 51/42* (2006.01)
*H01L 31/0256* (2006.01)
(52) U.S. Cl. .................. 136/263; 136/243; 136/252; 438/57; 438/82
(58) Field of Classification Search ............. 136/252 K, 136/254, 257, 263; 257/40, 461, 436, 431, 257/214.1; 438/82, 94, 65
See application file for complete search history.

(56) References Cited

U.S. PATENT DOCUMENTS

| | | | | |
|---|---|---|---|---|
| 6,097,147 | A * | 8/2000 | Baldo et al. ................. | 313/506 |
| 6,300,559 | B1 * | 10/2001 | Ohmori ....................... | 136/263 |
| 6,580,027 | B2 * | 6/2003 | Forrest et al. ................ | 136/263 |
| 7,061,011 | B2 * | 6/2006 | Forrest et al. ................. | 257/40 |
| 2003/0116775 | A1 * | 6/2003 | Matsuo et al. ................ | 257/98 |
| 2005/0098207 | A1 * | 5/2005 | Matsumoto et al. ......... | 136/263 |
| 2007/0145355 | A1 * | 6/2007 | Werner et al. ................. | 257/40 |
| 2008/0309222 | A1 * | 12/2008 | Thompson et al. .......... | 313/504 |

FOREIGN PATENT DOCUMENTS

KR   2002-0094735   12/2002

OTHER PUBLICATIONS

Kim et al., Enhanced Efficiency of Polymer: Fullerene Bulk Heterojunction Solar Cells with the Insertion of Thin Pyronin B layer neatr the Al electrode, School of Electrical Engineering and Nano Systems Institutte National Core Research Center, Seoul national Univ., Seou, pp. I 151-744, 2005).*
"Conference 5938: Organic Photovoltaics VI" 'Enhanced efficiency of polymer: fullerene bulk heterojunction solar cells with the insertion of thin pyromin B layer near the Al electrode', pp. 561 and 570, held on Aug. 2-4, 2005.

* cited by examiner

*Primary Examiner*—Jennifer K Michener
*Assistant Examiner*—Jayne Mershon
(74) *Attorney, Agent, or Firm*—Robert E. Bushnell, Esq.

(57) ABSTRACT

Provided is a photovoltaic device with an organic buffer layer for efficiency improvement. The photovoltaic device includes a first electrode and a second electrode disposed opposite to each other, a photoactive layer disposed between the first electrode and the second electrode, and a buffer layer disposed between the photoactive layer and the second electrode. The buffer layer includes a compound including an aromatic organic cation and an anion in a quantity ranging from 30 wt % to 100 wt %, more preferably 50 wt % to 100 wt % with respect to the entire weight of the buffer layer.

12 Claims, 4 Drawing Sheets

PHOTOVOLTAIC DEVICE

CROSS-REFERENCE TO RELATED APPLICATION AND CLAIM OF PRIORTY

This application claims priority to and the benefit of Korean Patent Application No. 10-2005-0129296 filed in the Korean Intellectual Property Office on Dec. 26, 2005, the entire content of which is incorporated herein by reference.

BACKGROUND OF THE INVENTION (a) Field of the Invention

The present invention relates to a photovoltaic device. More particularly, the present invention relates to a photovoltaic device that can improve efficiency by forming an organic buffer layer.

(b) Description of the Related Art

Photovoltaic devices that convert light signals into electrical signals can be applied to diverse fields such as sensors and solar batteries.

Since the photovoltaic devices are environment-friendly and have many advantages such as an infinite energy source and long life-span, many researchers are studying about the photovoltaic devices. However, since the photovoltaic devices are limited in improving their efficiency, they have been difficult to commercialize.

Diverse methods have been suggested to improve the photovoltaic efficiency. Among them is a method of forming a buffer layer of an inorganic chemical compound in a photovoltaic device.

However, buffer layers suggested so far have a problem in that they improve the photovoltaic efficiency not sufficiently and the formation of the buffer layers requires strict conditions.

To take an example, there is a method of forming a buffer layer of LiF, which is an inorganic compound, in an organic solar cell. Since LiF is a non-electric conductor, a thick LiF buffer layer rather decreases the photovoltaic efficiency of the organic solar cell.

Buffer layers should be formed thinner than 10 Å to improve the photovoltaic efficiency. When a thickness of a buffer layer is thicker than 10 Å by even a few Å, the efficiency of an organic solar cell is deteriorated.

However, it is substantially difficult to form a buffer layer uniformly in the thickness, and process conditions should be controlled strictly to form the uniform buffer layer thinner than 10 Å.

It is particularly difficult to form a buffer layer in a wide area if the buffer layer is less than 10 Å. Therefore, there is a problem in that the buffer layer is difficult to apply to a large-area organic solar cell.

In addition, since it is substantially difficult to form the buffer layer in a uniform thickness, there is a problem in that a buffer layer of an uneven thickness may lead to uneven efficiency of the photovoltaic device.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a photovoltaic device with improved photovoltaic efficiency and a buffer layer that is prepared easily.

One embodiment of the present invention provides a photovoltaic device that includes a first electrode and a second electrode arranged opposite to the first electrode, a photoactive layer arranged between the first electrode and the second electrode, and a buffer layer arranged between the photoactive layer and the second electrode. The buffer layer includes a compound including an aromatic organic cation and an anion in a quantity ranging from about 30 wt % to 100 wt % with respect to the entire weight of the buffer layer.

Herein, the buffer layer includes a compound including an aromatic organic cation in a quantity ranging from 30 wt % to 100 wt %, specifically from 50 wt % to 100 wt %, with respect to the entire weight of the buffer layer.

The buffer layer may further include an organic semiconductor material.

The compound may be doped with the organic semiconductor material, and, preferably, 100 parts by weight of the compound may be doped with less than 20 parts by weight of the organic semiconductor material.

The first electrode may be a transparent electrode and the second electrode may be a metal electrode.

The thickness of the buffer layer may be more than 10 Å, and the thickness of the buffer layer may range from 20 Å to 100 Å.

BRIEF DESCRIPTION OF THE DRAWINGS

A more complete appreciation of the present invention, and many of the above and other features and advantages of the present invention, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Hereinafter, embodiments of the present invention will be described in detail with reference to the accompanying drawings.

Figure 1:
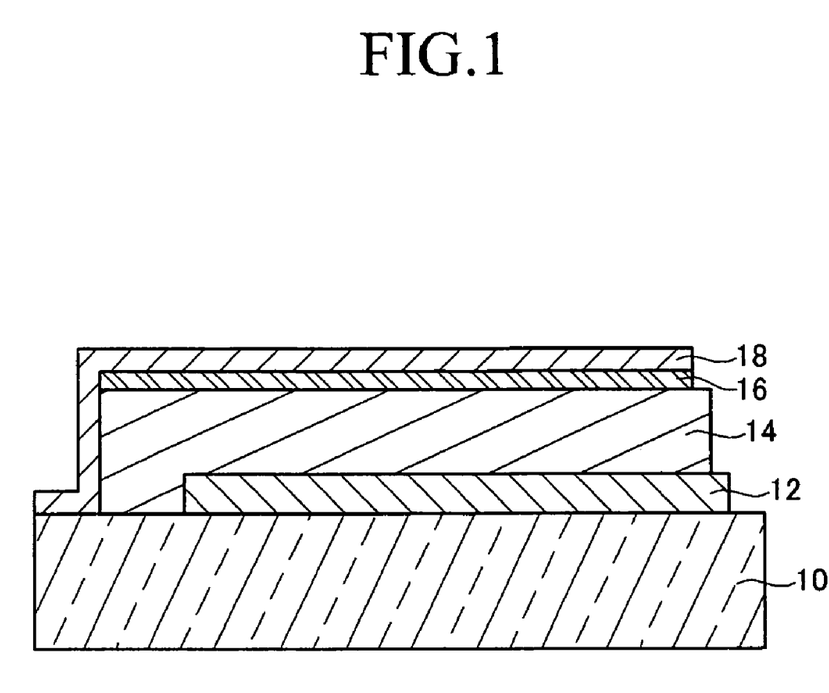
FIG. 1 is a partial cross-sectional view illustrating a photovoltaic device in accordance with an embodiment of the present invention.

FIG. 1 is a partial cross-sectional view illustrating a photovoltaic device in accordance with an embodiment of the present invention.

The photovoltaic device includes a first electrode 12 disposed on a transparent substrate 10, which is formed of glass or a plastic, a photoactive layer 14, a buffer layer 16, and a second electrode 18, which are sequentially disposed therein.

The photovoltaic device may be applied to various types of apparatuses, such as a solar cell, which absorb solar light and convert the light energy into electrical energy.

The first electrode 12 is formed of a material having a high work function. Specifically, the first electrode 12 may be formed of a transparent material through which light can penetrate. Examples of the transparent material include indium tin oxide (ITO), fluorine tin oxide (FTO), and indium zinc oxide (IZO).

The second electrode 18 may be formed of a metal having a low work function.

The second electrode 18 may be formed to be a single layer formed of Al, Ca, or Ag. Otherwise, the second electrode 18 may be formed to be a stack of multiple layers each formed of a different metal.

The photoactive layer 14 formed on the first electrode 12 includes an electron donor material and an electron acceptor material.

An additional layer (not shown) may be formed between the first electrode 12 and the photoactive layer 14. The additional layer may be formed of a mixture of polyethylene dioxythiophene (PEDOT) and poly(styrenesulfonate) (PSS).

The photoactive layer 14 may be prepared by forming heterojunctions between the electron donor material and the electron acceptor material, or it may be formed to be a multi-layer having a layer including the electron donor material and a layer including the electron acceptor material.

The electron donor material may be a semiconductor polymer having high optical absorbance, an organic monomolecule material, or a semiconductor particulate.

Examples of the semiconductor polymer include polyphenylene vinylene (PPV), polythiophene (PT), poly(3-hexylthiophene) (P3HT), and poly(2-methoxy-5-(3',7'-dimethyloctyloxy)-1,4-phenylene vinylene (MOMD-PPV). Examples of the monomolecule material include phthalocyanine-based materials such as copper pthalocyanine (CuPc) and zinc pthalocyanine (ZnPc). The semiconductor particulates include a single substance semiconductor such as silicon, a metal oxide, and a perovskite composite metal oxide. More specifically, the semiconductor particulates include Si, $TiO_2$, $SnO_2$, ZnO, $WO_3$, $Nb_2O_5$, $TiSrO_3$, and so on. According to one embodiment, an anatase ($TiO_2$) may be used.

The electron acceptor material may be fullerene ($C_{60}$) having a high electron affinity, derivatives of fullerene such as PCBM ([6,6]-phenyl C61-butyric acid methyl ester), perylene, or photosensitive dye molecules.

Generally, fullerene may be used as a fullerene-polymer composite, or it may be applied to a multi-layer structure.

The photoactive layer 14 may be formed by diverse methods such as spin coating, ink-jet printing, and screen printing.

A buffer layer 16 is arranged between the photoactive layer 14 and the second electrode 18.

The buffer layer 16 may include a compound including an aromatic organic cation.

The compound including the aromatic organic cation may be a compound including a benzene ring.

The aromatic organic cation may be expressed as Chemical Formula 1.

(1)

In Chemical Formula 1, $X_1$ and $X_2$ are $NR_cR_d$, where $R_c$ and $R_d$ are the same or each of them is independently selected from the group consisting of H and an alkyl group; $R_a$ is one selected from the group consisting of H, an alkyl group, a substituted aryl group, and an unsubstituted aryl group; and $R_b$ Is H or an alkyl group.

The aryl may be a benzene group, and the substituent of the substituted aryl group may be at least one selected from the group consisting of an ester group, a carboxyl group, a carbonyl group, and an alkyl group.

In the present specification, an alkyl group preferably includes 1 to 20 carbon atoms and an aryl group includes 6 to 20 carbon atoms.

The aromatic organic cation may be one among pyronine B, pyronine Y, rhodamine 4G, rhodamine 6G, rhodamine 3GO, rhodamine B, ethyl rhodamine B, and butyl rhodamine B. In the above Chemical Formula 1, the aromatic organic cation becomes pyronine B when $X_1$ and $X_2$ are $N(C_2H_5)_2$ and $R_a$ and $R_b$ are H. In Chemical Formula 1, the aromatic organic cation becomes pyronine Y when $X_1$ and $X_2$ are $N(CH_3)_2$, and $R_a$ and $R_b$ are H. In Chemical Formula 1, the aromatic organic cation becomes rhodamine 4G when $X_1$ and $X_2$ are $N(C_2H_5)_2$ and $NHC_2H_5$, respectively, and $R_a$ and $R_b$ are $C_6H_4COOC_2H_5$ and H, respectively. In Chemical Formula 1, the aromatic organic cation becomes rhodamine 6G when $X_1$ and $X_2$ are $NHC_2H_5$, and $R_a$ and $R_b$ are $C_6H_4COOC_2H_5$ and H, respectively. In Chemical Formula 1, the aromatic organic cation becomes rhodamine 3GO when $X_1$ and $X_2$ are $N(C_2H_5)_2$ and $NH_2$, respectively, and $R_a$ and $R_b$ are $C_6H_4COOC_2H_5$ and $CH_3$, respectively. In Chemical Formula 1, the aromatic organic cation becomes rhodamine B when $X_1$ and $X_2$ are $N(C_2H_5)_2$, and $R_a$ and $R_b$ are $C_6H_4COOH$ and H, respectively. In Chemical Formula 1, the aromatic organic cation becomes ethyl rhodamine B when $X_1$ and $X_2$ are $N(C_2H_5)_2$, and $R_a$ and $R_b$ are $C_6H_4COOC_2H_5$ and H, respectively. In Chemical Formula 1, the aromatic organic cation becomes butyl rhodamine B when $X_1$ and $X_2$ are $N(C_2H_5)_2$, and $R_a$ and $R_b$ are $C_6H_4COOC_4H_9$ and H, respectively.

The anion of the compound including the aromatic organic cation may be $Cl^-$ or $NO_3^-$.

Since the compound used in the buffer layer 16 includes an aromatic organic cation and an anion in the present invention, a dipole moment is formed between the photoactive layer 14 and the second electrode 18 to thereby lower an electron entering barrier. Thus, electrons can be transferred easily and this leads to improvement in the efficiency of a photovoltaic device.

To maximize the efficiency improvement, the buffer layer 16 may include the compound in the range of 30 wt % to 100 wt %, and preferably 50 wt % to 100 wt % with respect to the entire weight of the buffer layer 16.

In other words, the buffer layer 16 may be formed only of the compound or it may additionally include a material other than the compound.

The additional material included in the buffer layer 16 may be an organic semiconductor material. The compound may be doped with the semiconductor material in the buffer layer 16.

The efficiency of the photovoltaic device can be improved by letting the organic semiconductor material easily transfer only one of electrons and holes that are formed by solar light.

To maximize the efficiency, 100 parts by weight of the compound may be doped with less than 20 parts by weight of the organic semiconductor material.

The organic semiconductor material may be an n-type organic semiconductor material, and the n-type organic semiconductor material may be any one selected from the group consisting of fullerene ($C_{60}$) and materials expressed in Chemical Formulas 2 to 31.

(2)

(3)

(4)

(6)

(7)

(8)

(9)

-continued

(14)

(15)

(16)

(17)

(18)

(19)

(20)

(21)

(22)

(23)

(24)

(25)

(26)

(27)

(28) (29)

(30)

(31)

In the above Chemical Formulas 2 to 31, $R_1$ to $R_4$, $R_{23}$, and $R_{24}$ are the same or independently selected from fluoroalkyl groups, and $R_5$ to $R_{22}$, $R_{25}$, and $R_{26}$ are the same or independently selected from alkyl groups. Also, n, m, l, p, q, u, v, and y denote polymerization degrees, individually, and they may range from 1 to 100.

In the present specification, the fluoroalkyl groups include 1 to 20 carbon atoms.

Herein, $R_1$ to $R_4$, $R_{23}$, and $R_{24}$ may be $C_6F_{13}$, $R_5$ and $R_6$ may be $C_4F_9$, while $R_{15}$ to $R_{20}$ may be $C_4H_9$.

The buffer layer 16 may be formed by performing vacuum deposition, spin coating, ink-jet printing, or screen printing.

However, the present invention is not limited to the methods.

When the buffer layer 16 is thinner than 10 Å, it is difficult to form the buffer layer 16 in a uniform thickness. Therefore, it is desirable to form the buffer layer 16 equal to or thicker than 10 Å. The buffer layer 16 may be more preferably formed in a thickness of 20 Å to 100 A to improve the efficiency of the photovoltaic device.

As described above, since the buffer layer 16 has excellent photovoltaic efficiency when the buffer layer 16 is formed thicker than a conventional buffer layer formed of LiF, the restriction on the thickness of the buffer layer 16 becomes minimized.

Therefore, it is possible to improve the photovoltaic efficiency by forming the buffer layer under the conditions that are not severely strict and to thus fabricate a high-efficiency photovoltaic device a bit more easily.

With this thickness, since it is not difficult to form a buffer layer in a uniform thickness, the photovoltaic device can uniformly maintain the efficiency in the entire surface.

The photovoltaic device is applied to a solar cell, and an operation of the photovoltaic device in the solar cell will be described hereinafter.

When light, such as sunbeams, enters by penetrating through the transparent substrate 10 and the first electrode 12, pairs of an electron and a hole are generated in an electron donor. The electrons and holes are separated from each other as the generated electrons transfer to an electron acceptor.

An electron is separated from a hole by fast charge transfer between the electron donor and the electron acceptor, which is called Photo-induced Charge Transfer (PICT).

The free electron and hole are inputted into the electrodes 12 and 18 to thereby generate electrical energy.

An organic solar cell prepared as above is inexpensive and easily prepared due to the use of an organic material. Also, it can be formed in the form of a flexible thin film.

However, the present invention should not be understood to be limited thereto. The buffer layer of the photovoltaic device, which is suggested in the present invention, can be formed between an electrode and a photoactive layer in other types of solar batteries and sensors.

Herein, "formed between" not only means that the buffer layer of the photovoltaic device is formed in contact with the electrode and the photoactive layer, but also that it is formed with another film interposed between them.

Hereinafter, examples of the present invention and comparative examples will be described. Although the present invention is described by taking an organic solar cell as an example in the following examples, the present invention is not limited thereto. In short, the following examples are only illustrative but not restrictive.

EXAMPLE 1

A layer was formed of a mixture of polyethylene dioxythiophene and poly(styrene sulfonate) on a first electrode formed of indium tin oxide. Then, a photoactive layer was formed of poly(2-methoxy-5-(3',7'-dimethyloctyloxy)-1,4-phenylenevinylene) and PCBM expressed as Chemical Formula 5 in a thickness of 700 Å.

Herein, the weight ratio of poly(2-methoxy-5-(3',7'-dimethyloctyloxy)-1,4-phenylenevinylene) to PCBM of the Chemical Formula 5 was 1:2.

Subsequently, a buffer layer was formed of pyronine B, which is a material of Chemical Formula 1 when $X_1$ and $X_2$ are $N(CH_2CH_3)_2$ and $R_a$ and $R_b$ are H, in a thickness of 50 Å, and a second electrode was formed of Al in a thickness of 100 Å to thereby prepare an organic solar cell.

The solar cell had dimensions of 1.4 mm in width and 1.4 mm in length.

EXAMPLE 2

An organic solar cell was prepared in the same method as in Example 1, except that the buffer layer was formed of pyronine B and a material of Chemical Formula 11, which will be referred to as NTCDA hereinafter, in the weight ratio of 10:1.

EXAMPLE 3

An organic solar cell was prepared in the same method as in Example 1, except that the buffer layer was formed of pyronine B and NTCDA in the weight ratio of 20:1.

EXAMPLE 4

An organic solar cell was prepared in the same method as in Example 1, except that the buffer layer was formed of pyronine B and NTCDA in the weight ratio of 40:1.

COMPARATIVE EXAMPLE 1

An organic solar cell was prepared in the same method as in Example 1, except that the buffer layer was not formed.

COMPARATIVE EXAMPLE 2

An organic solar cell was prepared in the same method as in Example 1, except that the buffer layer was formed of LiF in a thickness of 5 Å.

COMPARATIVE EXAMPLE 3

An organic solar cell was prepared in the same method as in Example 1, except that the buffer layer was formed of pyronine B and NTCDA in the weight ratio of 1:3.

COMPARATIVE EXAMPLE 4

An organic solar cell was prepared in the same method as in Example 1, except that the buffer layer was formed of pyronine B and NTCDA in the weight ratio of 1:20.

COMPARATIVE EXAMPLE 5

An organic solar cell was prepared in the same method as in Example 1, except that the buffer layer was formed of pyronine B and NTCDA in the weight ratio of 1:40.

Voltage (V) and current (I) characteristics of the organic solar batteries prepared according to Examples 1 to 4 and Comparative Examples 1 to 5 were measured by radiating a light source of 7.42 mW/cm² thereto. The results are presented in FIG. 2.

Figure 2:
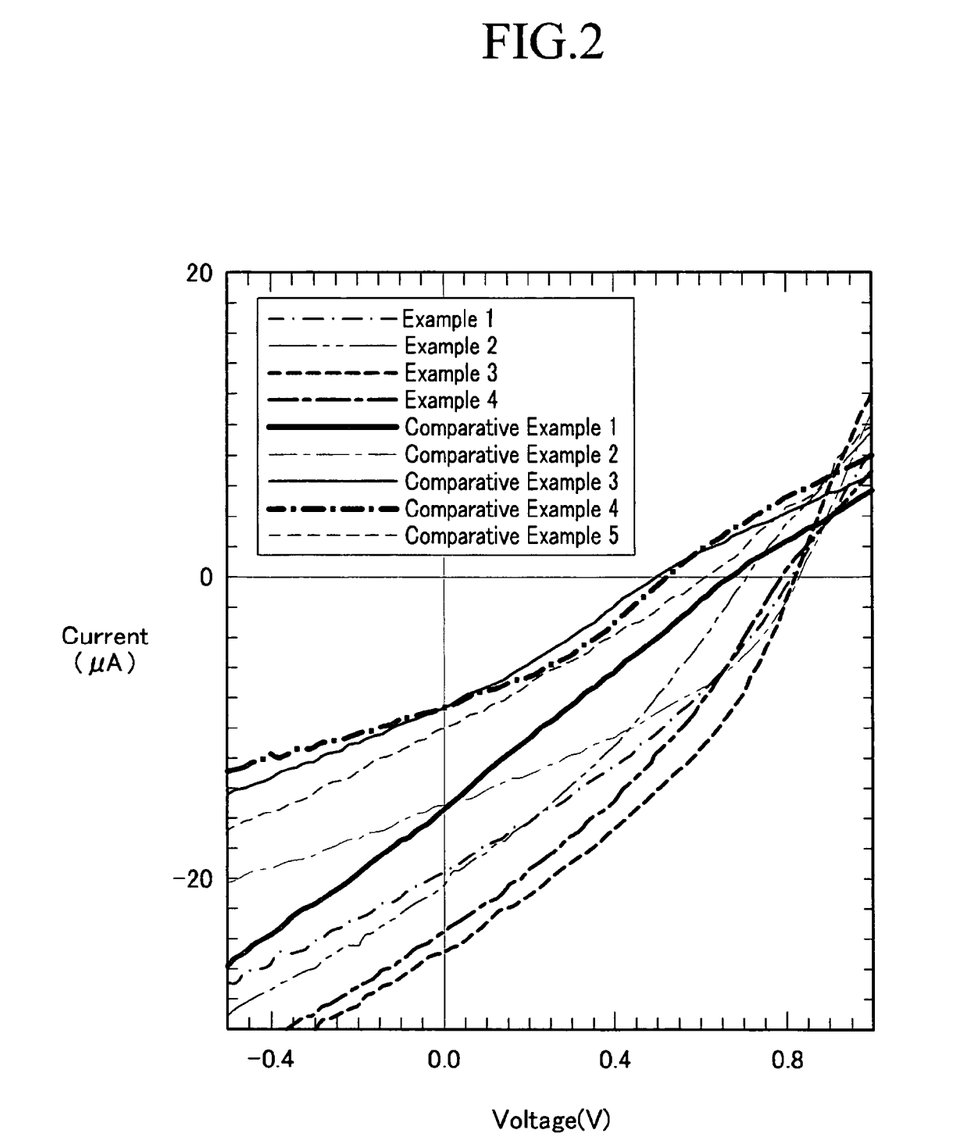
FIG. 2 is a graph showing voltage-current characteristics of organic solar batteries prepared in accordance with Examples 1 to 4 and Comparative Examples 1 to 5.

As shown in FIG. 2, the organic solar batteries of Examples 1 to 4 had excellent open voltage ($V_{oc}$) and short-circuit current density ($J_{sc}$), compared to the organic solar cell of Comparative Example 1 without a buffer layer.

While the current-voltage characteristic graph of the organic solar cell of Comparative Example 1 was almost a straight line, the current-voltage characteristic graphs of the organic solar batteries of Examples 1 to 4 were formed to have wider inner areas than the graph of the organic solar cell of Comparative Example 1.

In short, it can be seen that the organic solar batteries of Examples 1 to 4 had higher efficiencies ($\eta$) than the organic solar cell of Comparative Example 1.

It can also be seen that the organic solar batteries of Examples 1 to 4 had high efficiencies ($\eta$) even when they were compared with the organic solar cell of Comparative Example 2.

Herein, the organic solar cell of Comparative Example 2 had a 5 Å-thick buffer layer, which in reality is very difficult to form in a uniform thickness, to maximize the efficiency ($\eta$). Accordingly, when the buffer layer of Comparative Example 2 has a feasible thickness (i.e., thicker than the thickness of Comparative Example 2), the efficiency of Comparative Example 2 cannot be practically acquired.

Meanwhile, since the organic solar batteries of Examples 1 to 4 had a remarkable efficiency improvement effect even though they have a 50 Å-thick buffer layer, it can be understood that the buffer layers can be formed in a thickness that can be uniform under the conditions that are not severely strict.

When the organic solar batteries of Examples 1 to 4 were compared with the organic solar batteries prepared according to Comparative Examples 3 to 5, it turned out that those of Examples 1 to 4 had excellent open voltage ($V_{oc}$), short-circuit current ($J_{sc}$), and efficiency ($\eta$) characteristics.

Also, the organic solar batteries of Examples 2, 3 and 4 having less than 20 parts by weight of NTCDA with respect to 100 parts by weight of the compound had higher efficiencies ($\eta$) than the organic solar battery of Example 1.

EXAMPLE 5

An organic solar cell was prepared in the same method as in Example 3, except that the buffer layer was formed to have a thickness of 20 Å.

Voltage-current characteristics were measured by radiating white light of 112 mW/cm² onto the organic solar batteries prepared according to Example 5 and Comparative Examples 1 and 2. The results are presented in FIG. 3.

Figure 3:
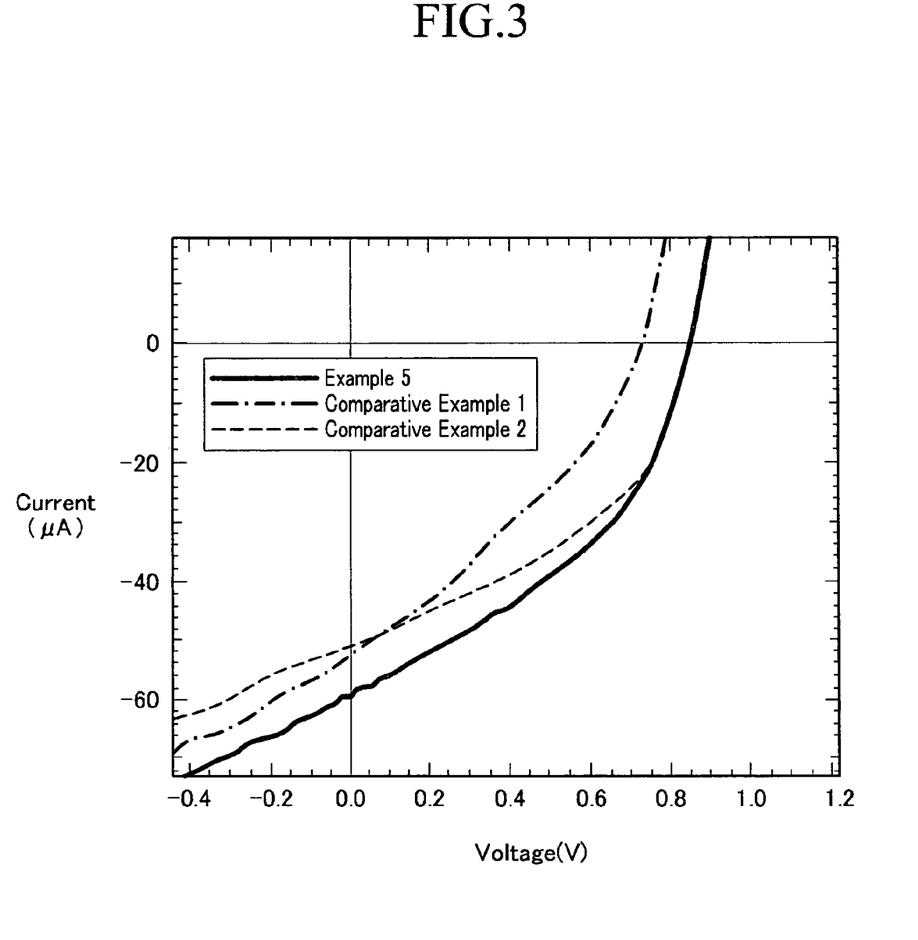
FIG. 3 is a graph showing voltage-current characteristics of organic solar batteries prepared in accordance with Example 5 and Comparative Examples 1 to 2.

In the current-voltage characteristic graph of FIG. 3, the open voltage ($V_{oc}$), the short-circuit current density ($J_{sc}$), a fill factor (FF), efficiency ($\eta_w$) with respect to white light, and incident photon-to-current conversion efficiency (IPCE) were evaluated and are presented in Table 1.

Efficiencies were measured by radiating light having a wavelength of 480 nm onto the organic solar batteries of Example 5 and Comparative Examples 1 and 2. The results are shown in Table 1.

TABLE 1

|  | $V_{OC}$ [V] | $J_{SC}$ [mA/cm²] | FF [%] | $\eta_w$ [%] | $\eta_{480nm}$ [%] | IPCE [%] |
|---|---|---|---|---|---|---|
| Example 5 | 0.847 | 3.03 | 40.5 | 0.930 | 5.05 | 36.16 |
| Comparative Example 1 | 0.751 | 2.67 | 33.8 | 0.605 | 3.70 | 33.90 |
| Comparative Example 2 | 0.849 | 2.59 | 42.2 | 0.830 | 5.22 | 37.84 |

It can be seen from FIG. 3 and Table 1 that the organic solar cell of Example 5 had excellent open voltage ($V_{oc}$), short-circuit current density ($J_{sc}$), fill factor (FF), and efficiency ($\eta_w$) with respect to white light, and incident photon-to-current conversion efficiency (IPCE), compared to the organic solar cell of Comparative Example 1.

The organic solar cell of Example 5 had a similar open voltage characteristic to that of Comparative Example 2 and had a general-level efficiency ($\eta_w$) to white light of 0.930, which was superior to the white light efficiency of the organic solar cell of Comparative Example 2.

Herein, the organic solar cell of Comparative Example 2 had a buffer layer of 5 Å. When it is considered that the thickness id very difficult to form uniformly in reality, the efficiency improvement effect in the organic solar cell of Example 5 is quite significant.

EXAMPLE 6

An organic solar cell was formed in the same method as in Example 5, except that the buffer layer was formed in a thickness of 30 Å.

EXAMPLE 7

An organic solar cell was formed in the same method as in Example 5, except that the buffer layer was formed in a thickness of 100 Å.

Voltage-current characteristics were measured by radiating white light of 112 mW/cm² onto the organic solar batteries prepared according to Examples 3, 6 and 7. The results are shown in FIG. 4.

Figure 4:
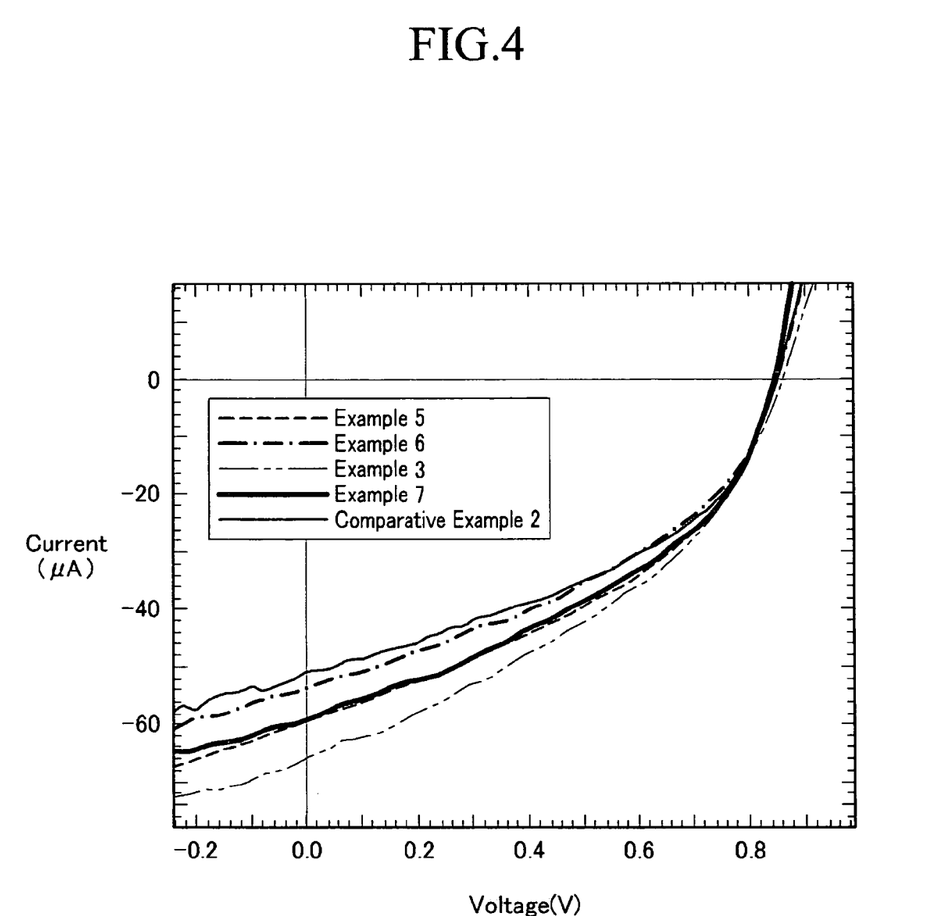
FIG. 4 is a graph showing voltage-current characteristics of organic solar batteries prepared in accordance with Examples 3 and 5 to 7, and Comparative Example 2.

For comparison, the voltage-current characteristics of the organic solar batteries of Example 5 and Comparative Example 2 are presented together in FIG. 4.

Open voltage ($V_{oc}$), short-circuit current density ($J_{sc}$), fill factor (FF), efficiency ($\eta_w$) with respect to white light, and incident photon-to-current conversion efficiency (IPCE) were evaluated in the voltage-current characteristics shown in FIG. 4. The evaluation results are shown in Table 2.

Efficiencies ($\eta_{480nm}$) of the organic solar batteries prepared according to Examples 3, 6 and 7 were measured by radiating light having a wavelength of 480 nm. The results are presented in Table 2.

For comparison, efficiencies of the organic solar batteries of Examples 5 and Comparative Example 2 are presented together in Table 2.

TABLE 2

|  | $V_{OC}$ [V] | $J_{SC}$ [mA/cm²] | FF [%] | $\eta_w$ [%] | $\eta_{480nm}$ [%] | IPCE [%] |
|---|---|---|---|---|---|---|
| Example 5 | 0.847 | 3.03 | 40.5 | 0.930 | 5.05 | 36.16 |
| Example 6 | 0.846 | 3.17 | 38.5 | 0.920 | 4.85 | 37.32 |
| Example 3 | 0.859 | 3.37 | 37.9 | 0.978 | 5.79 | 45.08 |
| Example 7 | 0.844 | 3.04 | 39.4 | 0.903 | 5.26 | 38.73 |
| Comparative Example 2 | 0.849 | 2.59 | 42.2 | 0.830 | 5.22 | 37.84 |

It can be seen from Table 2 that the organic solar batteries of Examples 3, 5, 6 and 7 had excellent open voltage ($V_{oc}$), short-circuit current density ($J_{sc}$), fill factor (FF), and efficiency ($\eta_w$) with respect to white light, regardless of the thickness of the buffer layer.

In short, it was confirmed that the efficiency was improved when the buffer layer was formed thick as in the organic solar batteries of Examples 3 and 6, compared with Comparative Example 2.

Particularly, the organic solar cell of Example 3 had much better characteristics than the organic solar cell of Comparative Example 2.

Although the present invention is described in the above based on an organic solar cell, which is an example of a photovoltaic device, the present invention is not limited to the organic solar cell but it can be applied to diverse photovoltaic devices.

The photovoltaic device of the present invention can have improved open voltage, short-circuit current density, fill factor, efficiency, and incident photon-to-current conversion efficiency (IPCE) by including aromatic organic cations and anions and forming a dipole moment.

The efficiency of the photovoltaic device can be even more improved by doping the buffer layer with an organic semiconductor material to thereby easily and stably transfer any of holes and electrons.

Since the buffer layer has excellent electron conductivity when the buffer layer is formed thick, it can improve the characteristics of the photovoltaic device. Therefore, the buffer layer can prevent the characteristics of the photovoltaic device from being developed unevenly, which is caused by a thin buffer layer, and improve the reliability of the photovoltaic device.

Also, since the buffer layer is formed under less strict process conditions, the fabrication process becomes easy.

This effect is more distinctive when the buffer layer is applied to a large-area photovoltaic device.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:
1. A photovoltaic device, comprising:
a first electrode;
a second electrode arranged opposite to the first electrode;
a photoactive layer arranged between the first electrode and the second electrode, the photoactive layer generating electrons and holes when absorbing light, the photoactive layer comprising an electron donor material and an electron acceptor material;

a buffer layer arranged between the photoactive layer and the second electrode, the buffer layer comprising a compound including an aromatic organic cation and an anion, the compound being in a quantity ranging from about 30 wt % to 100 wt % with respect to the entire weight of the buffer layer; and wherein the aromatic cation is expressed as Chemical Formula 1:

wherein $X_1$ and $X_2$ are $NR_cR_d$, where $R_c$ and $R_d$ are the same or independently selected from the group consisting of H and an alkyl group;

$R_a$ is one selected from the group consisting of H, an alkyl group, a substituted aryl group, and an unsubstituted aryl group; and $R_b$ is one selected from the group consisting of H and an alkyl group.

2. The photovoltaic device of claim 1, wherein the buffer layer further comprises an organic semiconductor material.

3. The photovoltaic device of claim 1, wherein the compound is doped with the organic semiconductor material.

4. The photovoltaic device of claim 2, wherein 100 parts by weight of the compound is doped with less than 20 parts by weight of the organic semiconductor material.

5. The photovoltaic device of claim 1, wherein the buffer layer comprises the compound in a quantity ranging from 50 wt % to 100 wt % with respect to the entire weight of the buffer layer.

6. The photovoltaic device of claim 1, wherein the aromatic organic cation is selected from the group consisting of pyronine B, pyronine Y, rhodamine 4G, rhodamine 6G, rhodamine 3GO, rhodamine B, ethyl rhodamine B, and butyl rhodamine B.

7. The photovoltaic device of claim 1, wherein the anion of the compound is one selected from the group consisting of $Cl^-$ and $NO_3^-$.

8. The photovoltaic device of claim 2, wherein the organic semiconductor material is an n-type organic semiconductor material.

9. The photovoltaic device of claim 8, wherein the organic semiconductor material is one selected from the group consisting of fullerene ($C_{60}$) and materials expressed as Chemical Formulas 2 to 31:

(2)

(3)

(4)

(5)

(6)

(7)

-continued

(8)

(9)

(10)

(11)

(12)

(13)

(14)

(15)

(16)

(17)

(18)

(19)

-continued

(20)

(21)

(22)

(23)

(24)

(25)

(26)

(27)

(28)

(29)

(30)

(31)

where $R_1$ to $R_4$, $R_{23}$, and $R_{24}$ are the same or independently fluoroalkyl groups;

$R_5$ to $R_{22}$, $R_{25}$, and $R_{26}$ are the same or independently fluoroalkyl groups; and n, m, l, p, q, u, v, and y independently denote polymerization degrees, and ranges from 1 to 100.

10. The photovoltaic device of claim 1, wherein the buffer layer is equal to or thicker than 10 Å.

11. The photovoltaic device of claim 9, wherein a thickness of the buffer layer ranges from 20 Å to 100 Å.

12. The photovoltaic device of claim 1, wherein the first electrode is a transparent electrode and the second electrode is a metal electrode.

* * * * *